US008907339B2

(12) United States Patent
Wu

(10) Patent No.: US 8,907,339 B2
(45) Date of Patent: Dec. 9, 2014

(54) X-RAY DETECTOR

(71) Applicant: InnoLux Corporation, Miao-Li County (TW)

(72) Inventor: Chih-Hao Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 14/084,878

(22) Filed: Nov. 20, 2013

(65) Prior Publication Data

US 2014/0151684 A1    Jun. 5, 2014

(30) Foreign Application Priority Data

Dec. 3, 2012  (TW) .............................. 101145295 A

(51) Int. Cl.
*H01L 29/12* (2006.01)
*H01L 27/12* (2006.01)
*H01L 31/08* (2006.01)

(52) U.S. Cl.
CPC .......... *H01L 27/1225* (2013.01); *H01L 27/124* (2013.01); *H01L 31/085* (2013.01)
USPC .................. 257/43; 257/59; 257/72

(58) Field of Classification Search
USPC ................................................ 257/43, 59, 72
See application file for complete search history.

(56) References Cited

U.S. PATENT DOCUMENTS

| 2003/0189175 | A1* | 10/2003 | Lee et al. | 250/370.08 |
| 2007/0210257 | A1* | 9/2007 | Masuda et al. | 250/370.09 |
| 2014/0103347 | A1* | 4/2014 | Ishino | 257/59 |

\* cited by examiner

*Primary Examiner* — Tan N Tran
(74) *Attorney, Agent, or Firm* — Bacon & Thomas, PLLC

(57) ABSTRACT

An X-ray detector including a thin film transistor (TFT) substrate and a photo-diode array layer is disclosed. Each thin film transistor in the TFT substrate includes: a substrate; a gate-electrode on the substrate; a gate insulating layer on the gate-electrode; a semiconductor layer on the gate insulating layer, wherein a portion of the semiconductor layer covers the gate-electrode; an etching stop layer covering the semiconductor layer; a source-electrode and a drain-electrode respectively disposed on the etching stop layer, wherein the source-electrode and the drain-electrode are respectively electrically connected to the semiconductor layer through conductive via-holes each having a base portion at the semiconductor layer, and at least one of the projection areas of the base portions vertically projected on the substrate has a non-overlapping region beyond the projection area of the gate-electrode vertically projected on the substrate; and a passivation layer covering the source-electrode and the drain-electrode.

12 Claims, 8 Drawing Sheets

US 8,907,339 B2

X-RAY DETECTOR

CROSS REFERENCE TO RELATED APPLICATION

This application claims the benefits of the Taiwan Patent Application Serial Number 101145295, filed on Dec. 3, 2012, the subject matter of which is incorporated herein by reference.

BACKGROUND OF THE INVENTION

1. Field of the Invention

The present invention relates to an X-ray detector and, more particularly, to an X-ray detector with improved thin film transistor layout in which the capacitance value between the data line and the gate line can be reduced by decreasing the overlapping area between the data line and the gate line.

2. Description of Related Art

An X-ray detector is a device configured to detect X-ray digital image and can be applied in digital radiography. Compared to screen-film radiography, digital radiography has various advantages, such as better image quality, simple operation process and direct digital image capture.

FIGS. 1 and 2 show top views of conventional InGaZnO thin film transistors (IGZO TFTs) fabricated by an etching stop process. The thin film transistor shown in FIG. 1 includes a gate electrode 11, a source electrode 12, a drain electrode 13 and an IGZO layer 16. The source electrode 12 and the drain electrode 13 are respectively connected to the IGZO layer 16 through conductive via holes 14, 15. Further, the IGZO layer 16 extends beyond the gate electrode 11 and the conductive via holes 14, 15. Accordingly, in the thin film transistor illustrated in FIG. 1, the overlapping regions of the gate line and the data line contain the areas of both the conductive via holes 14, 15. As for another thin film transistor of FIG. 2 similar to that illustrated in FIG. 1, the width of the IGZO layer 16 is smaller than the width of the gate 11, and the conductive via holes 14, 15 are formed within the peripheral edges of the IGZO layer 16. Likewise, in the thin film transistor of FIG. 2, the overlapping regions of the gate line and the data line contain the areas of both the conductive via holes 14, 15.

For the above conventional pixel layout, the large overlapping areas between the data line and the gate line can cause high capacitance value therebetween and thus induce the increase of noise in signal reading and degradation of image quality.

Accordingly, for the InGaZnO (IGZO) thin film transistor in the X-ray detector, the reduction of capacitance value by decreasing the overlapping areas between data line and gate line is a key point to enhance the image quality of the X-ray detector.

SUMMARY OF THE INVENTION

The object of the present invention is to provide an X-ray detector with improved thin film transistor layout in which the capacitance value between the data line and the gate line can be reduced by decreasing the overlapping areas between the data line and the gate line.

To achieve the object, the present invention provides an aspect of an X-ray detector that includes: a thin film transistor substrate and a photo-diode array layer, wherein the photo-diode array layer has a plurality of photo-diodes each electrically connected to a corresponding thin film transistor.

The above-mentioned thin film transistor substrate includes a substrate, a plurality of data lines and a plurality of gate lines, and the neighboring data lines and gate lines are intersected to define a plurality of pixel regions. Each pixel region includes at least one thin film transistor, and the thin film transistor includes: a gate electrode disposed on the substrate; a gate insulating layer disposed on the gate electrode; a semiconductor layer disposed on the gate insulating layer, wherein a portion of the semiconductor layer covers the gate electrode; an etching stop layer disposed on the semiconductor layer to protect the semiconductor layer and maintain the semiconductor property; a source electrode and a drain electrode respectively disposed on the etching stop layer at two opposite sides, wherein the source electrode is electrically connected to the semiconductor layer through a first conductive via hole having a first base portion at the semiconductor layer, the drain electrode is electrically connected to the semiconductor layer through a second conductive via hole having a second base portion at the semiconductor layer, and at least one of the projection areas of the first and second base portions vertically projected on the substrate has a non-overlapping region beyond the projection area of the gate electrode vertically projected on the substrate; and a passivation layer covering the source electrode and the drain electrode. In order to decrease the overlapping area between the data line and the gate line, at least one of the projection areas of the first and second base portions vertically projected on the substrate and the projection area of the gate electrode vertically projected on the substrate can have an overlapping region with a width of 1 μm or more, which is smaller than the width of the projection area of the first base portion or the second base portion vertically projected on the substrate. Preferably, the width of the overlapping region can be 2 μm or more, and be smaller than the projection area of the first base portion or the second base portion vertically projected on the substrate. Accordingly, the capacitance value between the data line and the gate line can be reduced by decreasing the overlapping region between them without any adverse influence on the operation of the thin film transistor. Although the thin film transistor can normally work in the condition of the overlapping width being smaller than 1 μm, it may cause current drop.

In the above-mentioned thin film transistor substrate and thin film transistor, the substrate can be a glass or quartz substrate and is not limited thereto; the gate electrode, the source electrode and the drain electrode can be made of a conductive metal material, such as aluminum, chromium, tantalum and the like; the gate insulating layer can be made of a dielectric material, such as silicon oxide, silicon nitride, silicon oxynitride and the like; the semiconductor layer can be made of a metal oxide semiconductor material, such as indium zinc oxide (InZnO, IZO) or indium gallium zinc oxide (InGaZnO, IGZO), preferably is indium gallium zinc oxide (InGaZnO, IGZO); the etching stop layer can be made of an insulating material, such as silicon oxide (SiOx), silicon nitride (SiNx) or aluminum oxide ($Al_2O_3$); and the passivation layer can be made of a material for protecting the source electrode and the drain electrode, such as silicon nitride.

In the above-mentioned aspect, the drain electrode can be further electrically connected to the data line through a third conductive via hole. As a result, the resistance of the data line can be reduced without the drain electrode being thickened.

In this aspect, a scintillator layer and a reflective layer can be further disposed over the photo-diode array layer. In detail, the scintillator layer can be disposed on the photo-diode array layer, and the reflective layer can be disposed on the scintillator layer.

The present invention further provides another aspect of an X-ray detector, including: a thin film transistor substrate and a photo-diode array layer, wherein the photo-diode array layer has a plurality of photo-diodes each electrically connected to a corresponding thin film transistor disposed on the thin film transistor substrate.

In this aspect, the thin film transistor substrate includes a substrate, a plurality of data lines and a plurality of gate lines, and the neighboring data lines and gate lines are intersected define a plurality of pixel regions. Each pixel region includes a thin film transistor, and the thin film transistor includes: a substrate, a gate electrode disposed on the substrate; a gate insulating layer disposed on the gate electrode; a semiconductor layer disposed on the gate insulating layer, wherein the projection area of the semiconductor layer vertically projected on the gate electrode has a width smaller than the width of the projection area of the gate electrode vertically projected on the substrate; an etching stop layer disposed on the semiconductor layer; a source electrode and a drain electrode respectively disposed on the etching stop layer at two opposite sides, wherein the source electrode is electrically connected to the semiconductor layer through a first conductive via hole having a first base portion at the semiconductor layer, the drain electrode is electrically connected to the semiconductor layer through a second conductive via hole having a second base portion at the semiconductor layer, and at least one of the projection areas of the first and second base portions vertically projected on the substrate has a non-overlapping region beyond the projection area of the semiconductor layer vertically projected on the substrate; and a passivation layer covering the source electrode and the drain electrode.

In this aspect, at least one of the first and second conductive via holes can have a portion overlapping the semiconductor layer and another portion overlapping the gate electrode. Accordingly, the overlapping region between the data line and the gate line can also be reduced.

In this aspect, the width of the overlapping region between at least one of the projection areas of the first and second base portions vertically projected on the substrate and the projection area of the semiconductor layer vertically projected on the substrate can be 1 μm or more, and be smaller than the width of the projection area of the first base portion or the second base portion vertically projected on the gate insulating layer. Preferably, the width of the overlapping region can be 2 μm or more, and be smaller than the projection area of the first base portion or the second base portion vertically projected on the substrate.

Basically, the substrate can be a glass or quartz substrate and is not limited thereto; the gate electrode, the source electrode and the drain electrode can be made of a conductive metal material, such as aluminum, chromium, tantalum and the like; the gate insulating layer can be made of a dielectric material, such as silicon oxide, silicon nitride, silicon oxynitride and the like; the semiconductor layer can be made of a metal oxide semiconductor material, such as InZnO (IZO) or InGaZnO (IGZO), preferably InGaZnO (IGZO); the etching stop layer can be made of an insulating material, such as SiOx, SiNx or $Al_2O_3$; and the passivation layer can be made of a material for protecting the metal of the source electrode, the drain electrode, the first conductive via hole and the second conductive via hole, such as silicon nitride.

Moreover, the drain electrode of this aspect can be further electrically connected to the data line through a third conductive via hole. Accordingly, the resistance of the data line can be reduced without the drain electrode being thickened.

DETAILED DESCRIPTION OF THE PREFERRED EMBODIMENT

Hereafter, embodiments will be provided to specifically illustrate the present invention. Other advantages and effects of the invention will become more apparent from the disclosure of the present invention. Other various aspects also may be practiced or applied in the invention, and various modifications and variations can be made without departing from the spirit of the invention based on various concepts and applications.

Embodiment 1

Figure 3:
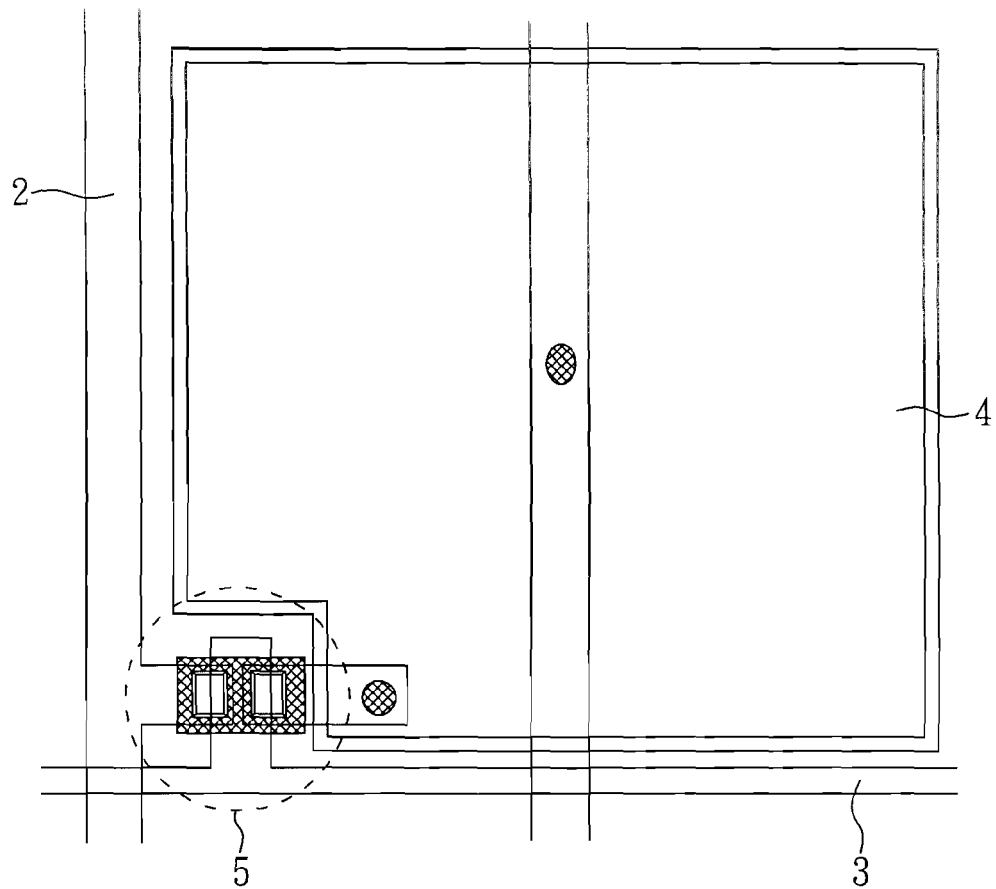
FIG. 3 is a pixel schematic view of an X-ray detector in accordance with Embodiment 1 of the present invention.
Figure 5:
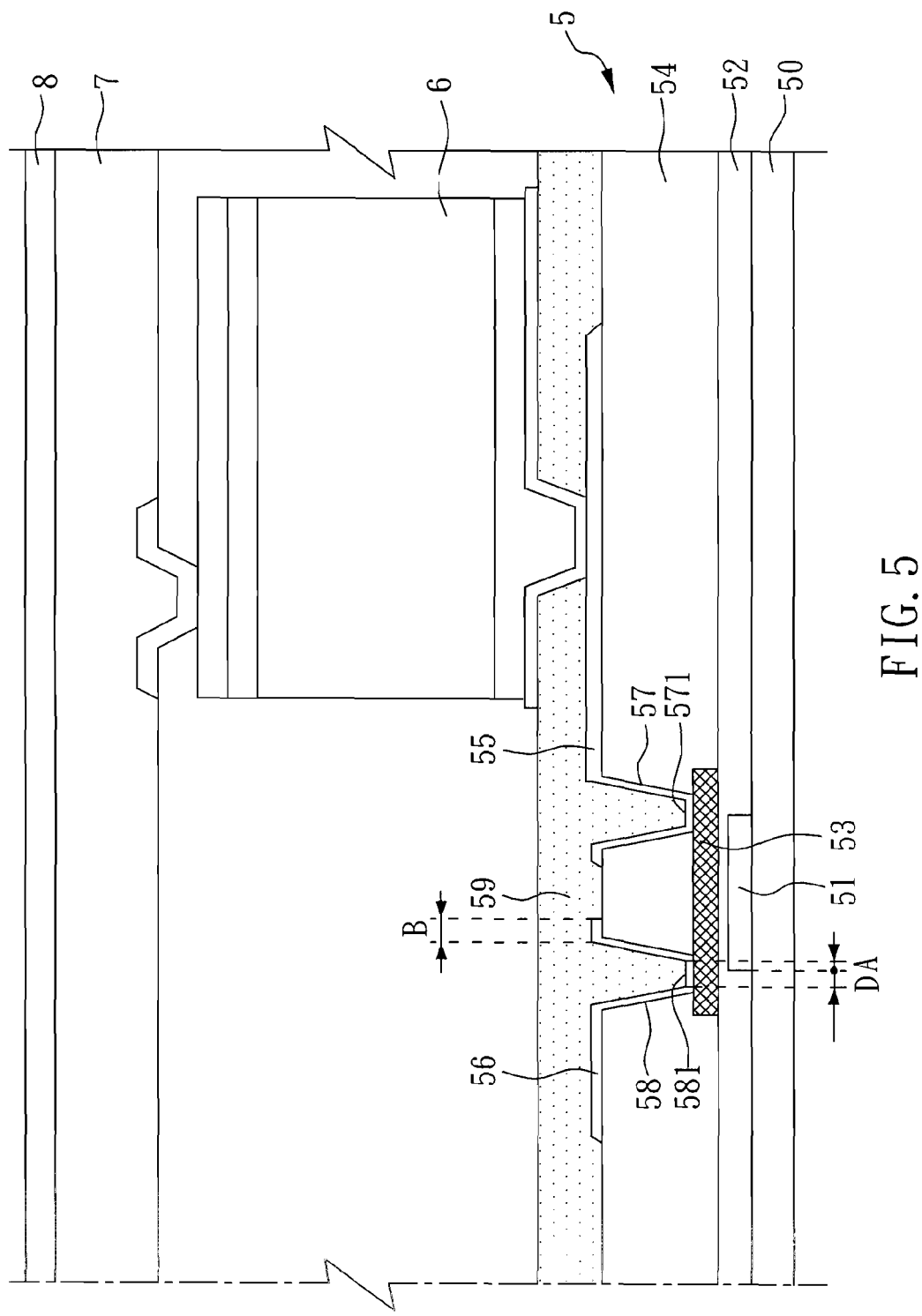
FIG. 5 is a cross-sectional view of an X-ray detector including thin film transistors in accordance with Embodiment 1 of the present invention.

Referring to FIGS. 3 and 5, FIG. 3 shows a pixel schematic view of an X-ray detector in accordance with Embodiment 1 of the present invention, and FIG. 5 is a cross-sectional view of an X-ray detector including thin film transistors in accordance with Embodiment 1 of the present invention. The X-ray detector of this embodiment includes: a thin film transistor substrate consisting of multiple thin film transistors 5 in an array; a p-i-n photo-diode array layer consisting of multiple p-i-n photo-diodes 6 in an array, in which each p-i-n photo-diode 6 is electrically connected to the corresponding thin film transistor 5; a scintillator layer 7 disposed on the photo-diode array layer; and a reflective layer 8, disposed on the scintillator layer 7. Herein, the thin film transistor substrate includes a substrate 50, a plurality of data lines 2 and a plurality of gate lines 3, and the neighboring data lines 2 and gate lines 3 are intersected to define a plurality of pixel regions 4. Each pixel region 4 includes a photo-diode 6 and a thin film transistor 5 electrically connected to the photo-diode 6.

Figure 4:
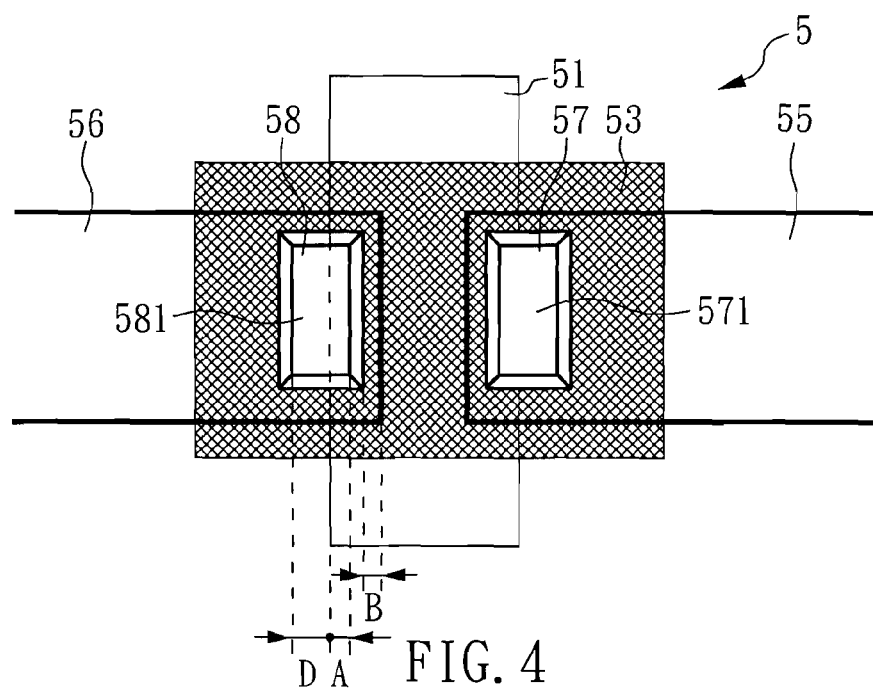
FIG. 4 is a top view of a thin film transistor in accordance with Embodiment 1 of the present invention.

Referring to FIGS. 4 and 5, FIG. 4 shows a top view of a thin film transistor in accordance with Embodiment 1 of the present invention. The thin film transistor 5 disposed on the substrate 50 of this embodiment includes: a gate electrode 51 disposed on the substrate 50; a gate insulating layer 52 disposed on the gate electrode 51; a semiconductor layer 53 disposed on the gate insulating layer 52, wherein a portion of the semiconductor layer 53 covers the gate electrode 51; an etching stop layer 54 disposed on the semiconductor layer 53 to protect the semiconductor layer 53 and maintain the semiconductor property thereof; a source electrode 55 and a drain electrode 56 respectively disposed on the etching stop layer 54 at two opposite sides, wherein the source electrode 55 is electrically connected to the semiconductor layer 53 through a first conductive via hole 57 having a first base portion 571 at the semiconductor layer 53, the drain electrode 56 is electrically connected to the semiconductor layer 53 through a second conductive via hole 58 having a second base portion 581 at the semiconductor layer 53, and the projection areas of the first and second base portions 571, 581 vertically projected on the substrate 50 individually have a non-overlapping region with a width D beyond the projection area of the gate electrode 51 vertically projected on the substrate 50; and a passivation layer 59 covering the source electrode 55 and the drain electrode 56.

In this embodiment, the semiconductor layer 53 is made of IGZO, the etching stop layer 54 is made of silicon oxide (SiOx), and the passivation layer 59 is made of silicon nitride.

Figure 1:
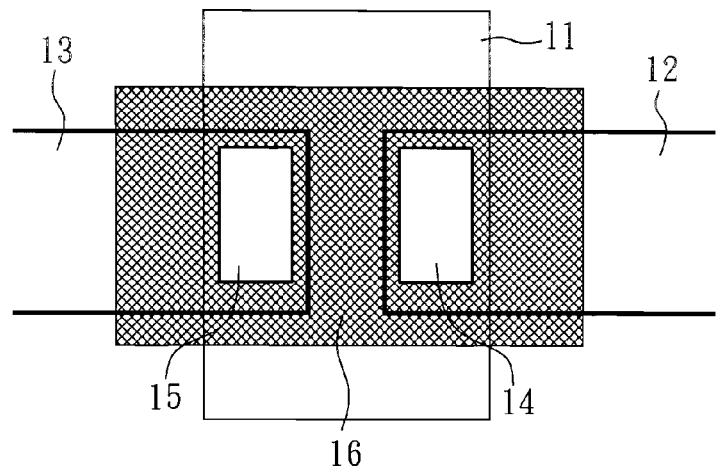
FIG. 1 is a top view of a conventional thin film transistor.

As shown in FIG. 4, in this embodiment, in order to decrease the overlapping region between the data line and the gate line, the width A of the overlapping region between the projection area of the first and second base portions 571, 581 vertically projected on the substrate 50 and the projection area of the gate electrode 51 vertically projected on the substrate 50 is reduced to 2 μm (p.s. the width of the first and second base portions 571, 581 each being 5 μm, and the width B at the peripheral edges being kept 1 μm for process requirement). Compared to the prior art of FIG. 1, this embodiment can significantly reduce the overlapping region between the data line and the gate line by decreasing the overlapping width between the gate electrode 51 and the conductive via hole from 5 μm to 2 μm. As a result, the TFT layout design of this embodiment can diminish the capacitance value between the data line and the gate line.

Embodiment 2

Figure 6:
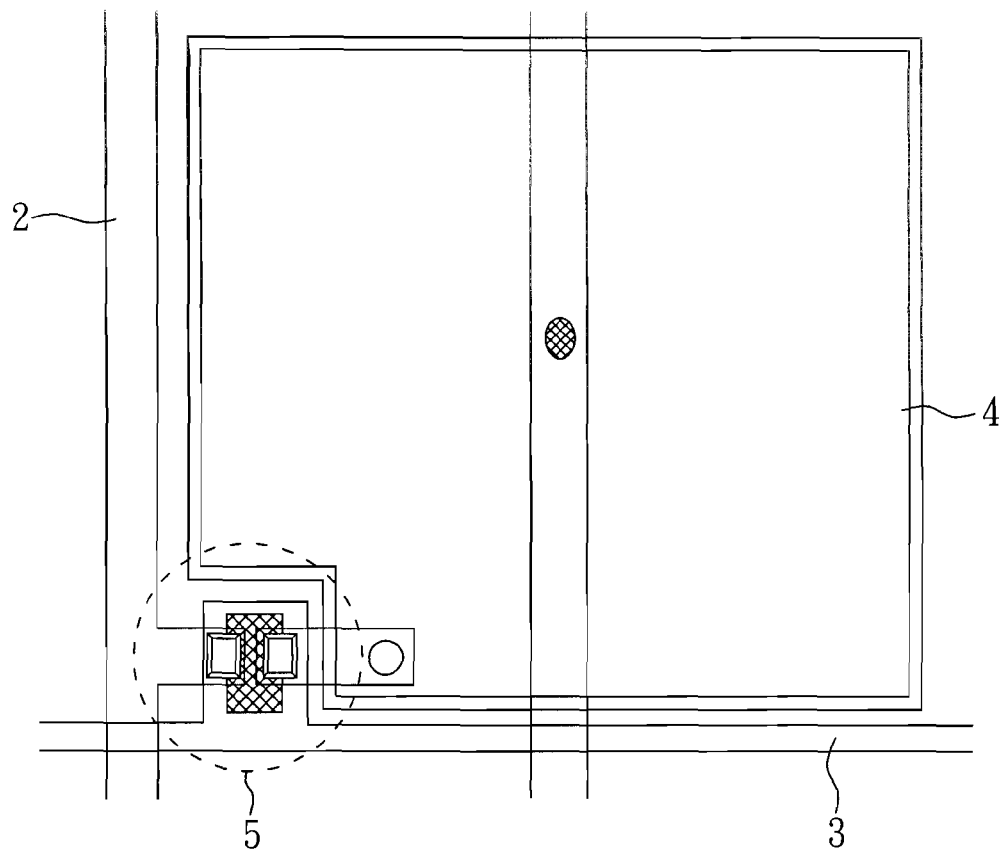
FIG. 6 is a pixel schematic view of an X-ray detector in accordance with Embodiment 2 of the present invention.
Figure 8:
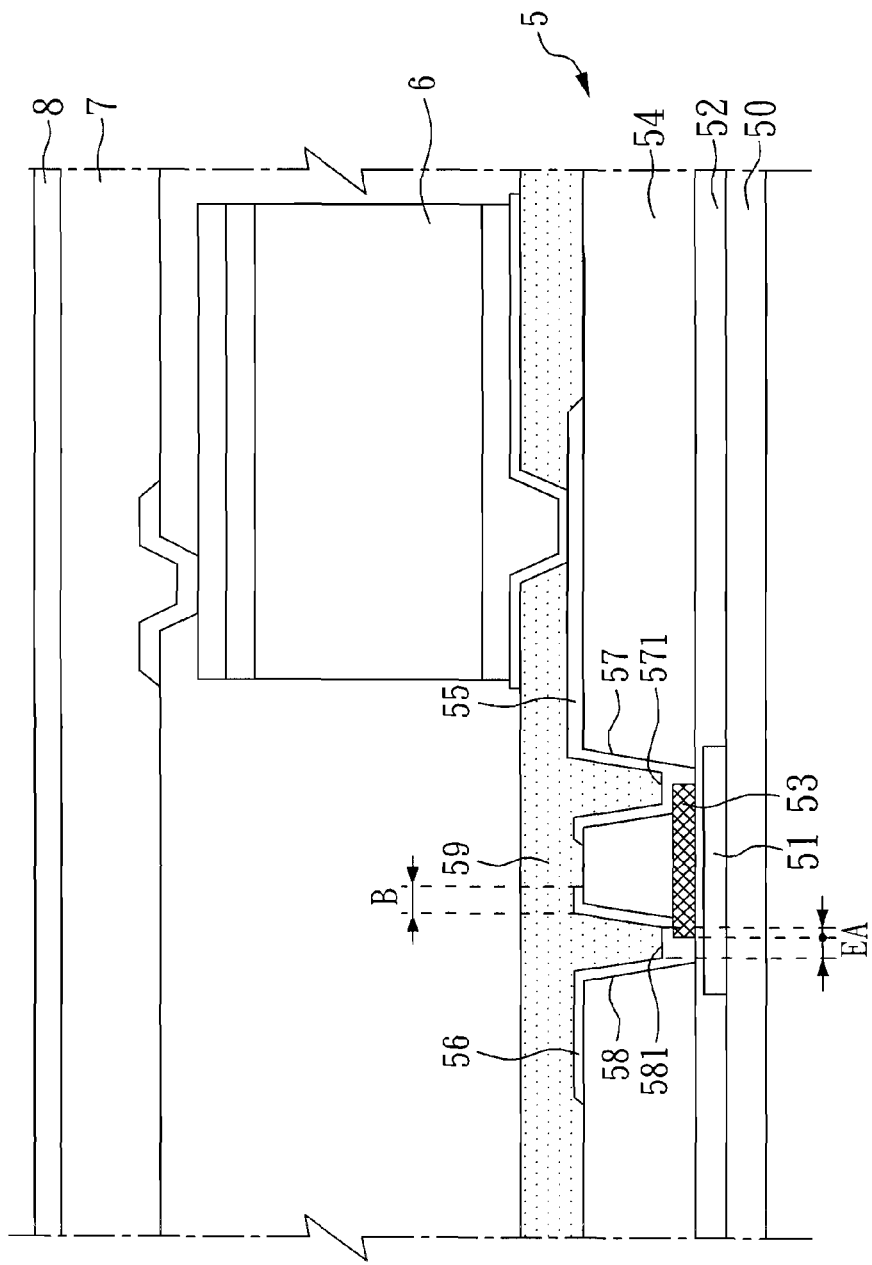
FIG. 8 is a cross-sectional view of an X-ray detector including thin film transistors in accordance with Embodiment 2 of the present invention.

Referring to FIGS. 6 and 8, FIG. 6 shows a pixel schematic view of an X-ray detector in accordance with Embodiment 2 of the present invention, and FIG. 8 is a cross-sectional view of an X-ray detector including thin film transistors in accordance with Embodiment 2 of the present invention. The X-ray detector of this embodiment is similar to that illustrated in Embodiment 1, except the layout design of the thin film transistor 5.

Figure 7:
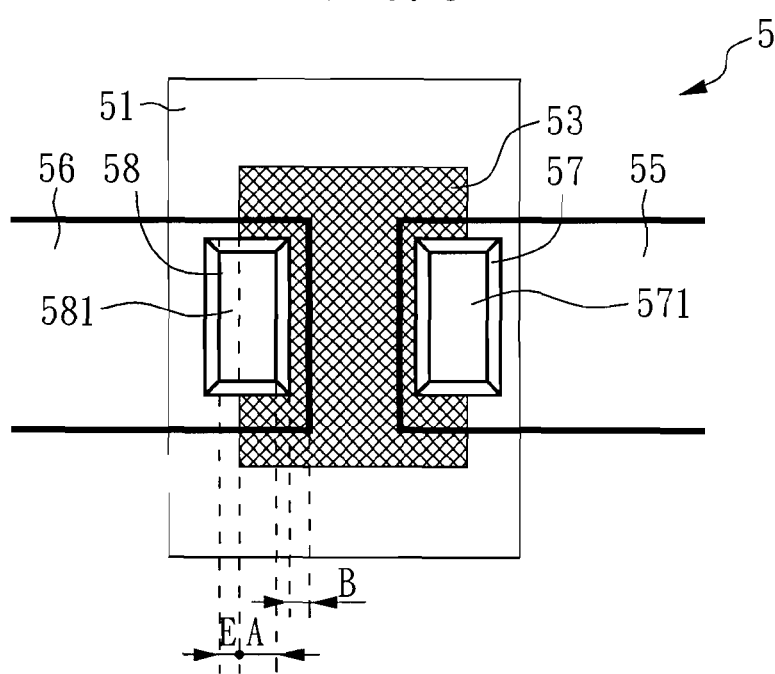
FIG. 7 is a top view of a thin film transistor in accordance with Embodiment 2 of the present invention.

As shown in FIG. 8 in conjunction with FIG. 7 that shows a top view of the thin film transistor according to Embodiment 2 of the present invention, the thin film transistor 5 forming on the substrate of the thin film transistor substrate of the X-ray detector includes: a gate electrode 51 disposed on the substrate 50; a gate insulating layer 52 disposed on the gate electrode 51; a semiconductor layer 53 disposed on the gate insulating layer 52, wherein the projection area of the semiconductor layer 53 vertically projected on the gate electrode 51 has a width smaller than that of the gate electrode 51 vertically projected on the substrate 50; an etching stop layer 54 disposed on the semiconductor layer 53; a source electrode 55 and a drain electrode 56 respectively disposed on the etching stop layer 54 at two opposite sides, wherein the source electrode 55 is electrically connected to the semiconductor layer 53 through a first conductive via hole 57 having a first base portion 571 at the semiconductor layer 53, the drain electrode 56 is electrically connected to the semiconductor layer 53 through a second conductive via hole 58 having a second base portion 581 at the semiconductor layer 53, and the projection areas of the first and second base portions 571, 581 vertically projected on the substrate 50 individually have a non-overlapping region with a width E beyond the projection area of the semiconductor layer 53 vertically projected on the substrate 50; and a passivation layer 59 covering the source electrode 55 and the drain electrode 56.

In this embodiment, the semiconductor layer 53 is a metal oxide semiconductor layer made of IGZO, the etching stop layer 54 is made of silicon oxide (SiOx), and the passivation layer 59 is made of silicon nitride.

Figure 2:
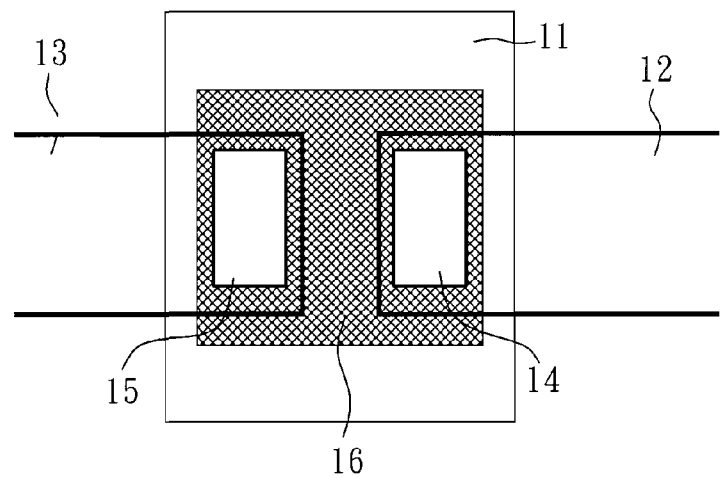
FIG. 2 is a top view of a conventional thin film transistor.

As shown in FIG. 7, in this embodiment, in order to decrease the overlapping region between the data line and the gate line, the width A of the first and second base portions 571, 581 overlapping the semiconductor layer 53 each is reduced to 2 μm (p.s. the width of the first and second base portions 571, 581 each being 5 μm, and the width B at the peripheral edges being kept 1 μm for process requirement). Compared to the prior art of FIG. 2, this embodiment can significantly reduce the overlapping region between the data line and the gate line by decreasing the overlapping width between the semiconductor layer 53 and the first and second base portions 571, 581 from 5 μm to 2 μm. As a result, the TFT layout design of this embodiment can diminish the capacitance value between the data line and the gate line.

Embodiment 3

Figure 9:
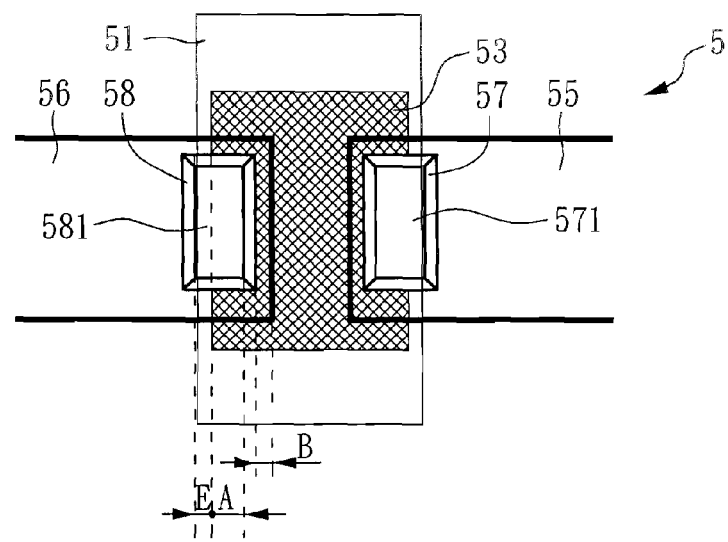
FIG. 9 is a top view of a thin film transistor in accordance with Embodiment 3 of the present invention.

FIG. 9 shows a top view of a thin film transistor in accordance with Embodiment 3 of the present invention. This embodiment is similar to Embodiment 2, except that the width of the overlapping region between the projection area of the first and second base portions 571, 581 vertically projected on the substrate 50 and the projection area of the gate electrode 51 vertically projected on the substrate 50 is reduced in this embodiment. This layout design also can reduce the overlapping region between the data line and the gate line, resulting in the decrease of the capacitance value between the data line and the gate line of the thin film transistor.

Embodiment 4

Figure 10:
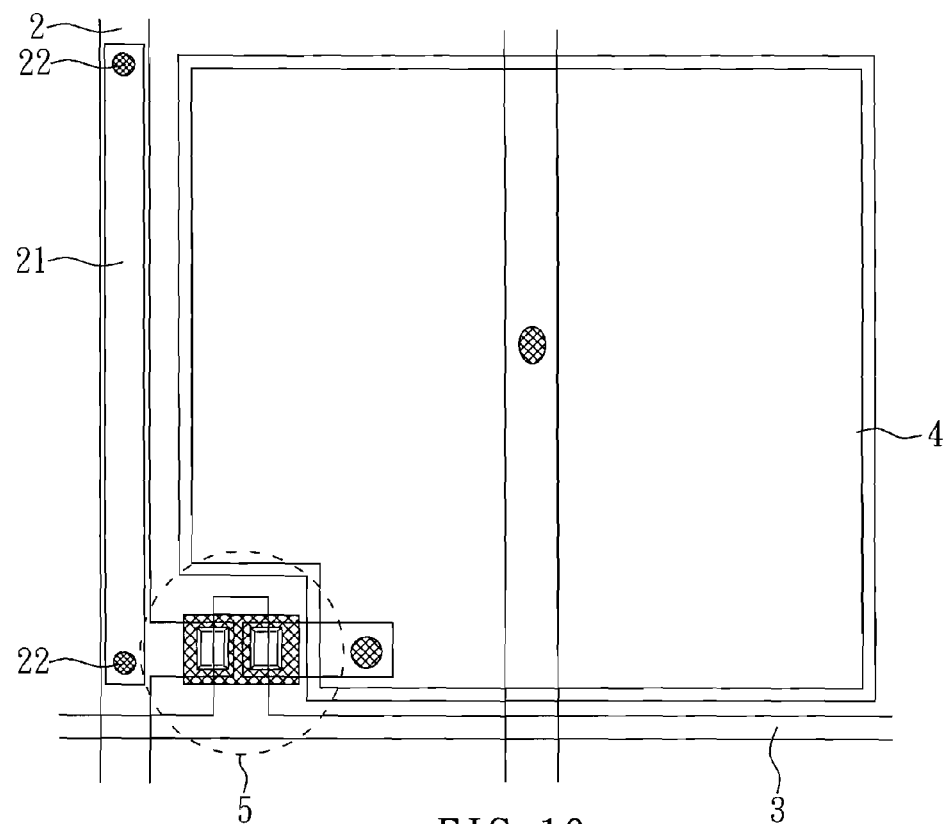
FIG. 10 is a pixel schematic view of an X-ray detector in accordance with Embodiment 4 of the present invention.
Figure 11:
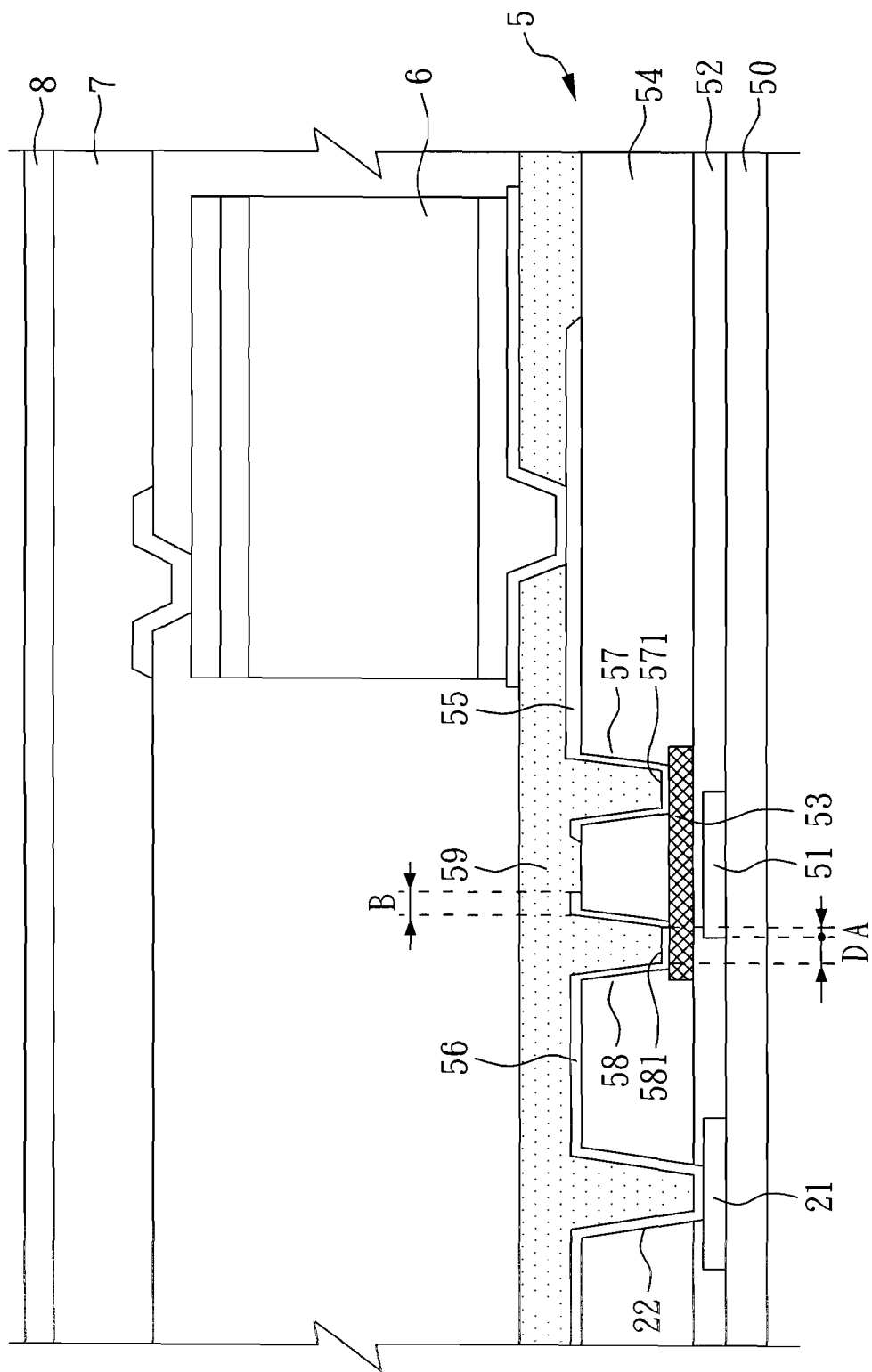
FIG. 11 is a cross-sectional view of an X-ray detector including thin film transistors in accordance with Embodiment 4 of the present invention.

Referring to FIGS. 10 and 11, FIG. 10 shows a pixel schematic view of an X-ray detector in accordance with Embodiment 4 of the present invention, and FIG. 11 is a cross-sectional view of an X-ray detector including thin film transistors in accordance with Embodiment 4 of the present invention.

This embodiment is similar to Embodiment 1, except that a conductive layer 21 is further disposed on the substrate 50. In this embodiment, the drain electrode 56 is electrically connected to the conductive layer 21 through a third conductive via 22 and is electrically connected to the data line 2. Accordingly, the resistance of the data line 2 can be reduced without the drain electrode 56 being thickened.

Embodiment 5

Figure 12:
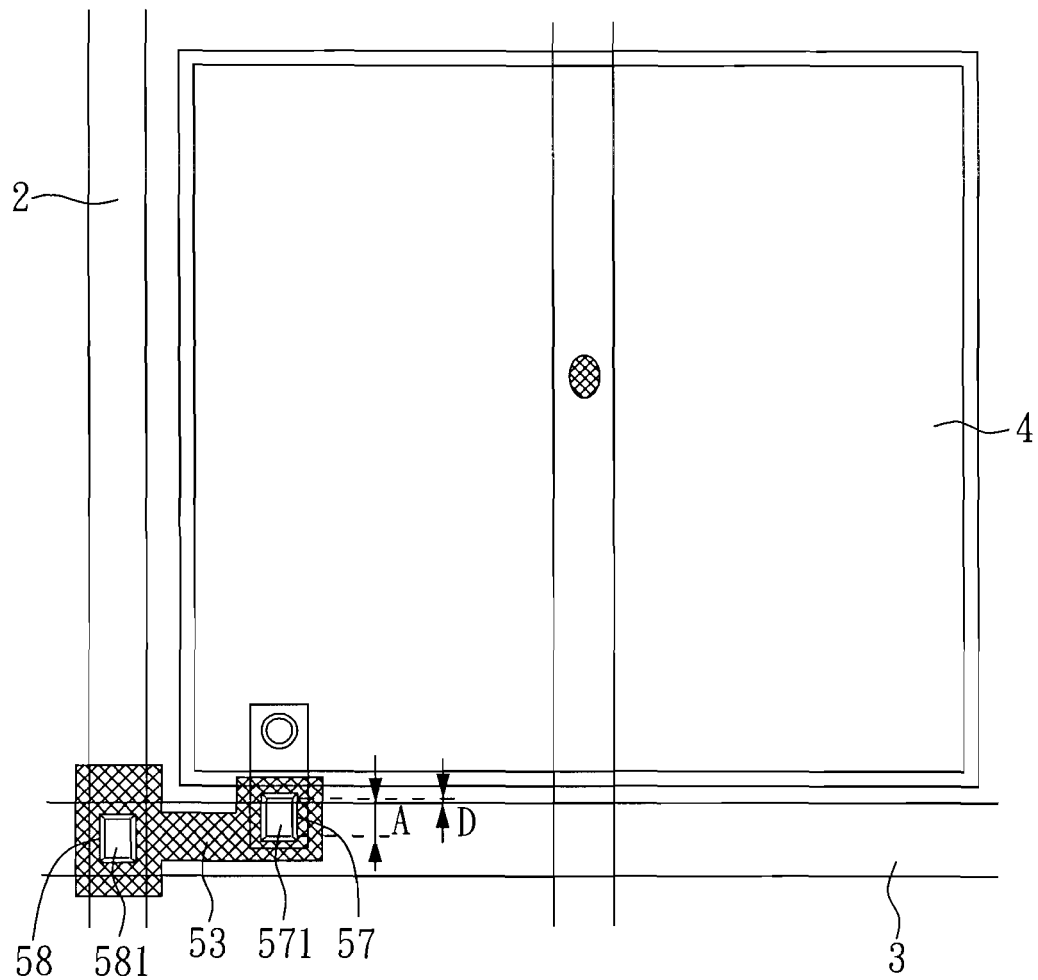
FIG. 12 is a pixel schematic view of an X-ray detector in accordance with Embodiment 5 of the present invention.

Referring to FIG. 12, it shows a pixel schematic view of an X-ray detector in accordance with Embodiment5 of the present invention.

This embodiment is another modified aspect of Embodiment 1. In this embodiment, the projection area of the first base portion 571 vertically projected on the substrate 50 of the thin film transistor substrate has a non-overlapping region with a width D beyond the projection area of the gate electrode 51 vertically projected on the substrate 50 of the thin film transistor, substrate while the whole vertical projection area of the second base portion 581 is completely located within the vertical projection area of the gate line 3. Herein, the first and second base portions 571, 581 each have a width of 5 μm, and the width A of the first base portion 571 overlapping the gate electrode 51 is 2 μm. Accordingly, compared to conventional aspects, the TFT layout design of this embodiment can reduce the capacitance value between the data line and the gate line by decreasing the overlapping region between the data line and the gate line.

The above embodiments are intended for illustrating the subject invention and the technical features thereof, but not for restricting the scope of protection of the subject invention. The scope of the subject invention is based on the claims as appended.

What is claimed is:

1. An X-ray detector, comprising:
a thin film transistor substrate, which comprises a substrate, a plurality of data lines and a plurality of gate lines intersected to define a plurality of pixel regions, wherein each of the pixel regions comprises at least one thin film transistor, and the thin film transistor comprises:
a gate electrode, disposed on the substrate;
a gate insulating layer, disposed on the gate electrode;
a semiconductor layer, disposed on the gate insulating layer,
wherein a portion of the semiconductor layer covers the gate electrode;
an etching stop layer, disposed on the semiconductor layer;
a source electrode and a drain electrode, respectively disposed on the etching stop layer;
a passivation layer, covering the source electrode and the drain electrode; and
a photo-diode array layer, having plurality of photo-diodes electrically connected to the corresponding thin film transistor;
wherein the source electrode is electrically connected to the semiconductor layer through a first conductive via hole having a first base portion at the semiconductor layer, the drain electrode is electrically connected to the semiconductor layer through a second conductive via hole having a second base portion at the semiconductor layer, and at least one of projection areas of the first base portion and the second base portion vertically projected on the substrate has a non-overlapping region beyond a projection area of the gate electrode vertically projected on the substrate.

2. The X-ray detector of claim 1, wherein the semiconductor layer is a metal oxide semiconductor layer whose material comprises indium zinc oxide (InZnO, IZO).

3. The X-ray detector of claim 1, wherein the semiconductor layer is a metal oxide semiconductor layer whose material comprises indium gallium zinc oxide (InGaZnO, IGZO).

4. The X-ray detector of claim 1, wherein at least one of the projection areas of the first base portion and the second base portion vertically projected on the substrate and the projection area of the gate electrode vertically projected on the substrate have an overlapping region with a width of 1 μm or more, which is smaller than a width of the projection area of the first base portion or the second base portion vertically projected on the substrate.

5. The X-ray detector of claim 1, wherein the drain electrode is further electrically connected to the data line through a third conductive via hole.

6. The X-ray detector of claim 1, further comprising a scintillator layer and a reflective layer over the photo-diode array layer, wherein the scintillator layer is disposed on the photo-diode array layer, and the reflective layer is disposed on the scintillator layer.

7. An X-ray detector, comprising:
a thin film transistor substrate, which comprises a substrate, a plurality of data lines and a plurality of gate lines intersected to define a plurality of pixel regions, wherein each of the pixel regions comprises at least one thin film transistor, and the thin film transistor comprises:
a gate electrode, disposed on the substrate;
a gate insulating layer, disposed on the gate electrode;
a semiconductor layer, disposed on the gate insulating layer,
wherein a width of a projection area of the semiconductor layer vertically projected on the gate electrode has been smaller than a width of a projection area of the gate electrode vertically projected on the substrate;
an etching stop layer, disposed on the semiconductor layer;
a source electrode and a drain electrode, respectively disposed on the etching stop layer;
a passivation layer, covering the source electrode and the drain electrode; and
a photo-diode array layer, having a plurality of photo-diodes electrically connected to the corresponding thin film transistor;
wherein the source electrode is electrically connected to the semiconductor layer through a first conductive via hole having a first base portion at the semiconductor layer, the drain electrode is electrically connected to the semiconductor layer through a second conductive via hole having a second base portion at the semiconductor layer, and at least one of projection areas of the first and second base portions vertically projected on the substrate has a non-overlapping region beyond a projection area of the semiconductor layer vertically projected on the substrate.

8. The X-ray detector of claim 7, wherein at least one of the projection areas of the first base portion and the second base portion vertically projected on the substrate and the projection area of the semiconductor layer vertically projected on the substrate have an overlapping region with a width of 1 μm or more, which is smaller than a width of a projection area of the first base portion or the second base portion vertically projected on the gate insulating layer.

9. The X-ray detector of claim 7, wherein the semiconductor layer is a metal oxide semiconductor layer whose material comprises indium zinc oxide (InZnO, IZO).

10. The X-ray detector of claim 7, wherein the semiconductor layer is a metal oxide semiconductor layer whose material comprises indium gallium zinc oxide (InGaZnO, IGZO).

11. The X-ray detector of claim 7, further comprising a scintillator layer and a reflective layer over the photo-diode array layer, wherein the scintillator layer is disposed on the photo-diode array layer, and the reflective layer is disposed on the scintillator layer.

12. The X-ray detector of claim 7, wherein the drain electrode is further electrically connected to the data line through a third conductive via hole.

* * * * *